United States Patent
Goth et al.

(10) Patent No.: US 6,760,221 B2
(45) Date of Patent: Jul. 6, 2004

(54) EVAPORATOR WITH AIR COOLING BACKUP

(75) Inventors: Gary F. Goth, Pleasant Valley, NY (US); Jody A. Hickey, Hyde Park, NY (US); Daniel J. Kearney, Ulster Park, NY (US); John J. Loparco, Poughkeepsie, NY (US); William D. McClafferty, New Paltz, NY (US); Donald W. Porter, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/278,503

(22) Filed: Oct. 23, 2002

(65) Prior Publication Data

US 2004/0080912 A1 Apr. 29, 2004

(51) Int. Cl.$^7$ ................................................ H05K 7/20
(52) U.S. Cl. ................... 361/699; 165/80.6; 174/16.1; 361/703; 361/701; 361/702
(58) Field of Search ............................ 174/16.1–16.2, 174/15.1–15.2; 165/80.3–80.4, 121–126, 185, 104.33, 104.22, 104.26, 137, 122, 153, 157, 146, 166–168; 361/700–703, 697–699

(56) References Cited

U.S. PATENT DOCUMENTS

| | | | |
|---|---|---|---|
| 5,159,529 A | * 10/1992 | Lovgren et al. | 361/699 |
| 5,239,200 A | * 8/1993 | Messina et al. | 257/714 |
| 5,285,347 A | * 2/1994 | Fox et al. | 361/699 |
| 5,329,993 A | 7/1994 | Ettehadieh | 165/104.14 |
| 5,482,113 A | 1/1996 | Agonafer et al. | 165/137 |
| 5,966,957 A | 10/1999 | Malhammar et al. | 62/259.2 |
| 6,135,200 A | * 10/2000 | Okochi et al. | 165/121 |
| 6,234,240 B1 | 5/2001 | Cheon | 165/80.3 |
| 6,252,771 B1 | * 6/2001 | Jordan | 361/704 |
| 6,305,463 B1 | * 10/2001 | Salmonson | 165/80.3 |
| 6,313,990 B1 | 11/2001 | Cheon | 361/699 |
| 6,321,451 B1 | 11/2001 | Lee et al. | 29/890.03 |
| 6,333,852 B1 | 12/2001 | Lin | 361/697 |

* cited by examiner

*Primary Examiner*—Gregory D. Thompson
(74) *Attorney, Agent, or Firm*—Floyd A Gonzalez; Cantor & Colburn LLP

(57) ABSTRACT

An integrated cooling unit configured to effect the removal of heat via a circulating liquid coolant includes a reservoir to contain the liquid coolant, a tubing arrangement disposed at an outer surface of the reservoir, a pump disposed within the reservoir, and a fan configured to provide a flow of air across the tubing arrangement to remove the heat. The tubing arrangement is fluidly communicable with a heat exchanging device, and the pump is configured to circulate the liquid coolant through the tubing arrangement to the heat exchanging device.

19 Claims, 4 Drawing Sheets

EVAPORATOR WITH AIR COOLING BACKUP

BACKGROUND

The present invention relates generally to a heat dissipating component and, more particularly, to an evaporator with backup thermal conductance for use with an electronic device.

The removal of heat from electronic components is a problem continuously faced by electronic packaging engineers. As electronic components have become smaller and more densely packed on integrated boards and chips, designers and manufacturers now are faced with the challenge of how to dissipate the heat generated by these components. It is well known that many electronic components, especially semiconductor components such as transistors and microprocessors, are more prone to failure or malfunction at high temperatures. Thus, the ability to dissipate heat often is a limiting factor on the performance of the component.

Electronic components within integrated circuits have been traditionally cooled via forced or natural convective circulation of air within the housing of the device. In this regard, cooling fins have been provided as an integral part of the component package or as separately attached elements thereto for increasing the surface area of the package exposed to convectively-developed air currents. Electric fans have also been employed to increase the volumetric flow rate of air circulated within the housing. For high power circuits (as well as smaller, more densely packed circuits of presently existing designs), however, simple air circulation often has been found to be insufficient to adequately cool the circuit components.

It is also well known that heat dissipation, beyond that which is attainable by simple air circulation, may be effected by the direct mounting of the electronic component to a thermal dissipation member such as a "cold-plate", evaporator, or other heat sink.

Such applications oftentimes incorporate the heat removal capabilities of refrigeration cooling systems at electronic modules of the circuitry by utilizing water-to-air cooling loop configurations, for example. Water-to-air cooling loop configurations generally include discretely positioned units between which fluid communication is maintained via tubing lines or similar conduits. The units of such configurations include pumps to circulate cooling water, heat exchange devices to transfer heat from the circuitry to the water, fans for providing cooling air flow across the heated water, and water storage reservoirs. The aggregated componentry of such configurations may occupy considerable volumes within their respective systems. Because space is at a premium in most electronics applications, particularly as the sizes of the systems are reduced to keep pace with technological trends, cooling systems may be likewise reduced in size. In addition, higher end modules having increased density of electronic circuitry require redundant or backup cooling means in the event that the primary refrigeration cooling unit fails, while limiting the space needed to employ such a redundant or secondary cooling means.

SUMMARY

This disclosure presents an apparatus for integrating the individual components of a cooling unit for electronics applications. The integrated cooling unit removes heat primarily via a refrigerant system having circulating refrigerant coolant and including a reservoir to contain the coolant, a tubing arrangement disposed at an outer surface of the reservoir, a pump disposed within the reservoir, and a fan to provide a flow of air across the tubing arrangement to remove the heat. The tubing arrangement is fluidly communicable with a heat exchanging device, and the pump circulates the liquid coolant through the tubing arrangement to the heat exchanging device.

DESCRIPTION OF THE DRAWINGS

The present disclosure will be better understood by those skilled in the pertinent art by referencing the accompanying drawings, where like elements are numbered alike in the several FIGURES, in which.

DETAILED DESCRIPTION

Figure 1:
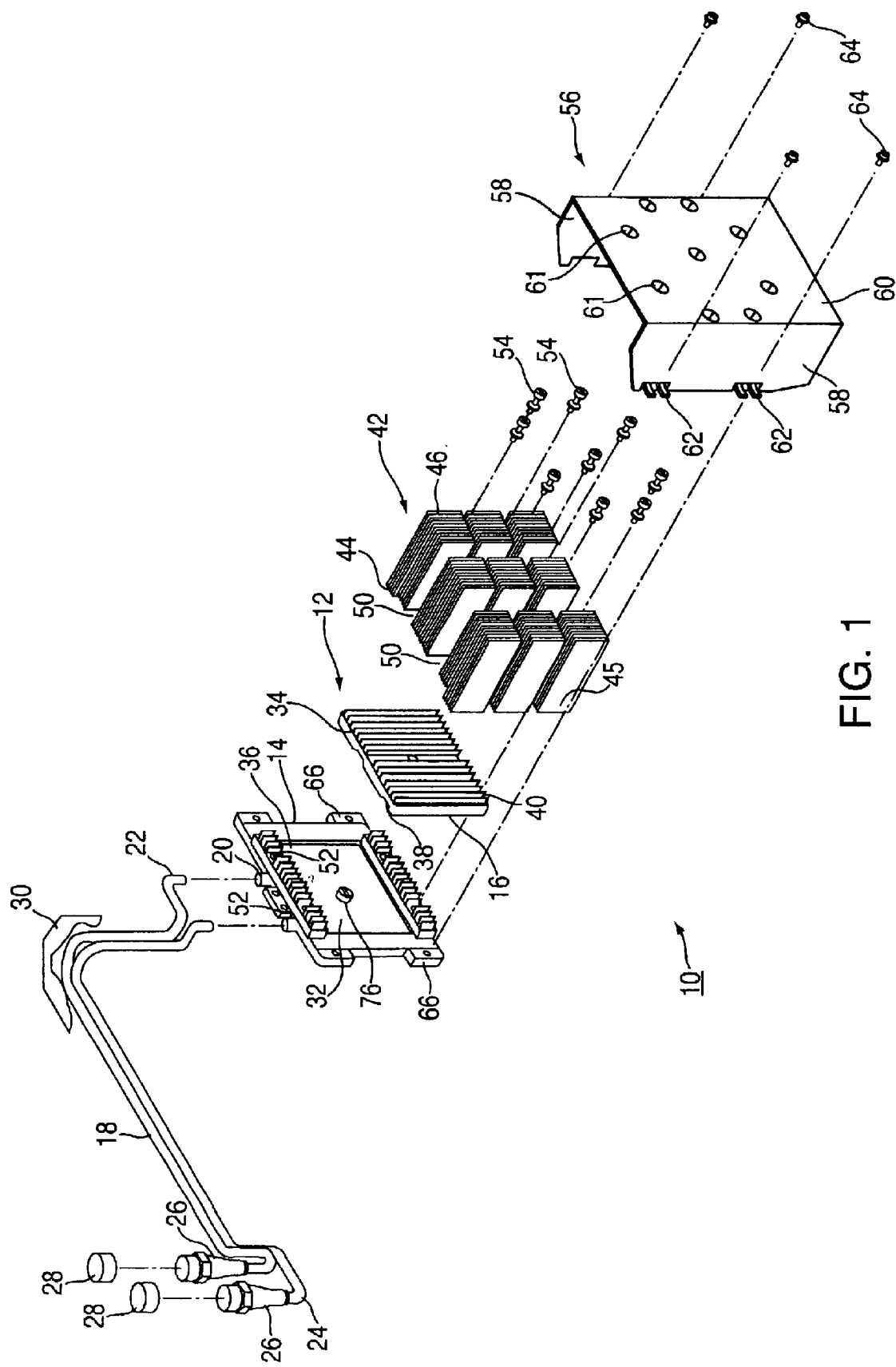
FIG. 1 is an exploded perspective view of an exemplary embodiment of an or unit in thermal communication with a backup air cooling unit.

Referring to FIG. 1, an exemplary embodiment of an integrated cooling unit is shown generally at 10 and is hereinafter referred to as "cooling unit 10." Cooling unit 10 provides for the removal of heat from electronic circuitry via circulation of a liquid coolant and the dissipation of the removed heat via forced convection of air. The circulation of the liquid coolant allows heat to be transferred to the coolant and subsequently removed by a fan, for example, that forces air over the circulating coolant. Although cooling unit 10 is described as being incorporable into computer-based applications in which heat is removed from electronic circuitry and dissipated through a liquid medium, it should be understood by those of skill in the art that cooling unit 10 may be utilized in other applications in which heat is generated and is to be dissipated to the surrounding environment. Furthermore, although cooling unit 10 is referred to as utilizing water as the circulating coolant, it should be understood by those of skill in the art that other liquids such as brine, alcohols, fluorocarbons, and halogenated. hydrocarbons may be used.

Cooling unit 10 comprises an evaporator shown generally at 12. Evaporator 12 includes a base plate portion 14 configured to receive a flow plate portion 16 of evaporator 12 therein and configured to receive and return liquid coolant via a tubing arrangement 18. Tubing arrangement 18 at one end 22 is configured to be received by an inlet and outlet manifold 20 configured in base plate portion 14. Tubing arrangement 18 at another end 24 includes couplings 26 for coupling with a condenser or coolant reservoir (not shown). Coupling caps 28 are removably attached to an open end of each coupling 26 which is attached to each tube of tubing arrangement 18 to prevent debris from entering before installation or during shipment of cooling unit 10.

A portion of insulation material 30 is shown in FIG. 1 used to surround a length of tubing arrangement 18 to insulate liquid coolant in tubing arrangement 18 from ambient air outside tubing arrangement 18.

Flow plate portion 16 is received in a cavity 32 configured in base plate portion 14 to receive a complementary configured edge 34 of flow plate portion 16 defining its periphery. An inner surface 36 defining a bottom of cavity 32 is substantially planar to abut an outer surface 38 defining a bottom surface of flow plate portion 16.

On a top surface 40 opposite bottom surface 38 of flow plate portion 16, a heat sink assembly 42 is disposed. In an exemplary embodiment, heat sink assembly 42 includes an evaporator lid 44 having a plurality of parallel spaced heat sink fins 46 extending from a top surface 45 of lid 44. Evaporator lid 44 and plurality of heat sink fins 46 are preferably fabricated of copper, although other suitable thermally conductive materials may be employed. In addition, fins 46 are preferably nickel plated in the event of local condensation occurs over the coldest regions of evaporator 12. The plurality of heat sink fins 46 are preferably soldered or brazed to evaporator lid 44. Generally, the fin arrangement is stamped as a continuous piece from sheet metal having a high thermal conductivity value. Other exemplary materials from which fins 46 can be fabricated include, but are not limited to, copper alloys, aluminum, aluminum alloys, and combinations of the foregoing materials. An adhesive, such as a solder or a thermal epoxy compound, is optionally employed to attach the fin arrangement to lid 44.

Lid 44 includes a plurality of apertures 50 configured therethrough and aligned with corresponding apertures 52 configured in evaporator 12 for receiving corresponding fasteners 54 to secure heat sink assy 42 to evaporator 12. It will be recognized that an area above each aperture 50 of lid 44 is vacated by the plurality of parallel spaced heat sink fins 46 to allow access of a tool (not shown) to the corresponding fastener and to allow air circulation of ambient air to a top surface of lid 44 in thermal contact with a top surface a evaporator 12.

A fin cover or shroud 56 is disposed opposite lid 44 having fin 46 therebetween. Shroud 56 is configured as a three-sided box structure having two sides 58 disposed at opposite ends and substantially perpendicular to a top cover 60. Shroud 56 is configured to protect fins 46 at an end portion and two sides thereof while allowing air flow to pass through fins 46 without limitation. Shroud 56 is configured with holes 61 in top cover 60 aligned with corresponding apertures 50 in lid 44 to provide access to fasteners 54, as well as provide additional air flow access through fins 46 substantially perpendicular to air flow through fins 46 between sides 58 of shroud 56. Each of the two sides 58 is further configured with a mounting means extending therefrom for attachment to base plate portion 14. In an exemplary embodiment, the mounting means includes a pair of flanges 62 extending from each side 58 and configured to engage a fastener 64 for engagement with a corresponding receiving flange 66 extending from base plate portion 14.

Figure 2:
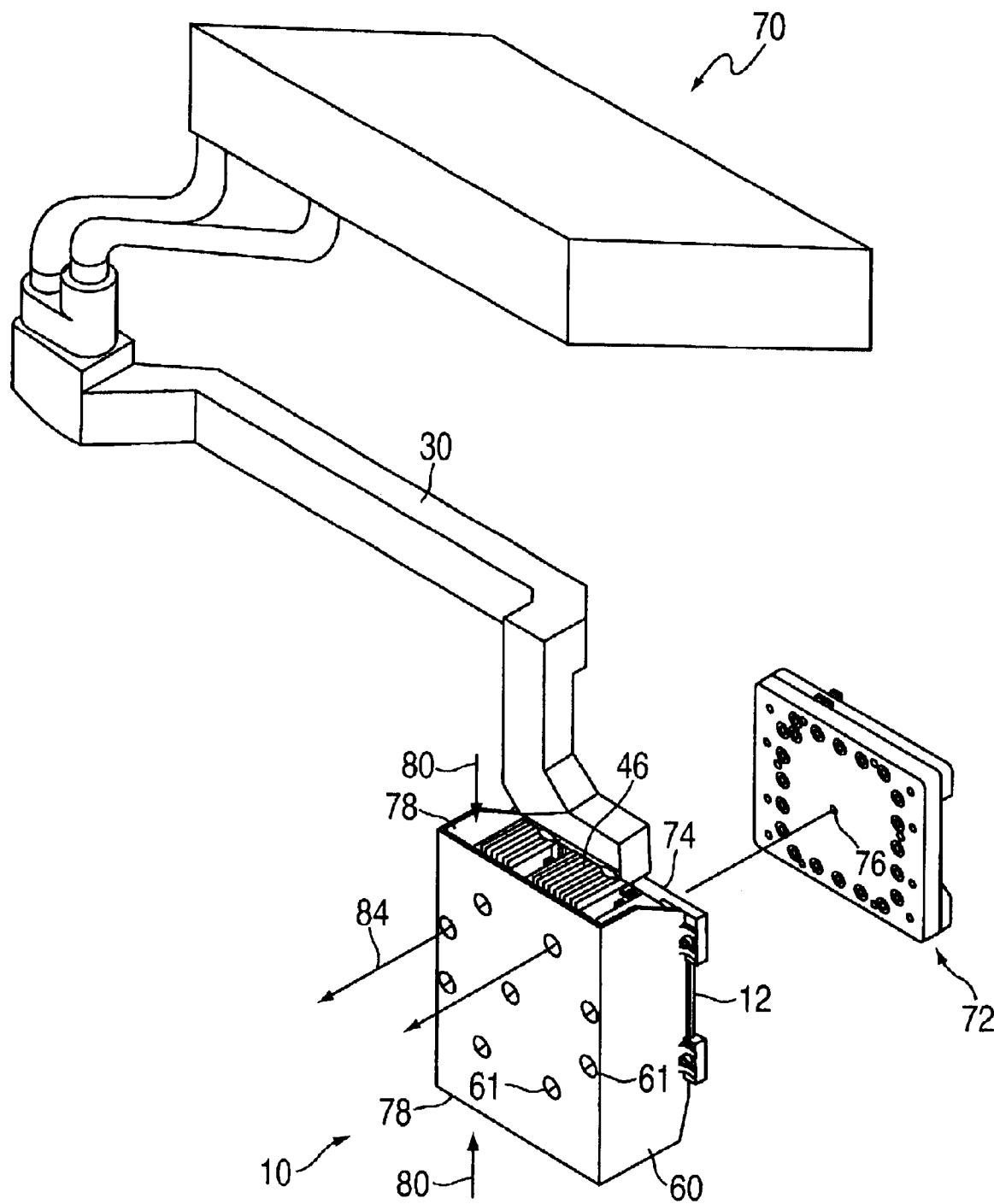
FIG. 2 is a perspective view of the evaporator unit in thermal communication with the backup air cooling unit of FIG. 1 assembled with insulation around inlet and outlet tubing to the evaporator unit and connected to a cooling reservoir.

Referring now to FIG. 2, cooling unit 10 of FIG. 1 is shown coupled with a cooling reservoir 70 to provide coolant to evaporator 12 for cooling a processor module or multi-chip module (MCM) 72 interfacing an opposite surface 74 to inner surface 32 of base plate portion 14. MCM 72 is operably coupled to base plate portion 14 using a coupling means through a corresponding aperture 76 configured in MCM 74 and base plate portion 14 (See FIG. 1). The coupling means optionally includes one centrally located of nine fasteners 54 depicted in FIG. 1.

Still referring to FIG. 2, tubing arrangement 18 is encased with insulation 30 to insulate coolant from reservoir 70 to evaporator 12. In an exemplary embodiment, insulation 30 is fabricated of a polyurethane structural foam, however other suitable insulation materials are contemplated to aid in insulating coolant in tubing arrangement 18. In an exemplary embodiment, tubing arrangement 18 is fabricated with two 5/16 inch nitrogenized copper refrigeration tubing. Again, other suitable refrigeration tubing is contemplated suitable to withstand the pressures generated during operation of cooling unit 10 and the temperatures associated with the electronic circuitry. The tubing arrangement is optionally arranged as a coil to effectively optimize available space between reservoir 70 and cooling unit 10.

As will be recognized by one skilled in the pertinent art, in one embodiment, reservoir 70 is in operable communication with a motor (not shown) that is operable communication with a pump (not shown) to provide coolant flow through tubing arrangement 18 and manifold 20 to evaporator 12 to effect heat removal from MCM 72.

In order to facilitate the cooling when refrigeration as a primary cooling means is not operational, a secondary cooling means includes a flow of air from lid 44 to effect the removal of sensible heat from MCM 72 in thermal contact with lid 44. The arrangement of fins 46 is disposed over lid 44 facilitates air flow cooling of MCM 72. Each fin of the plurality of fins 46 extends a length defining a length of lid 44. Shroud 60 is disposed over fins 46 and extends over the height of cooling unit 10 and around outboard fins 46 disposed on opposite sides of lid 44. A pair of openings 78 defined by shroud 60 at opposite ends serves as a primary air inlet (shown with arrows 80). The primary air inlet allows air to be inducted within shroud 60 and fins 46. As discussed above, shroud 60 also includes a plurality of secondary air inlets through holes 61 (discussed as apertures with reference to FIG. 1) through which air is drawn in the directions of arrows 84, between adjacently positioned fins 46, and over lid 44.

Figure 3:
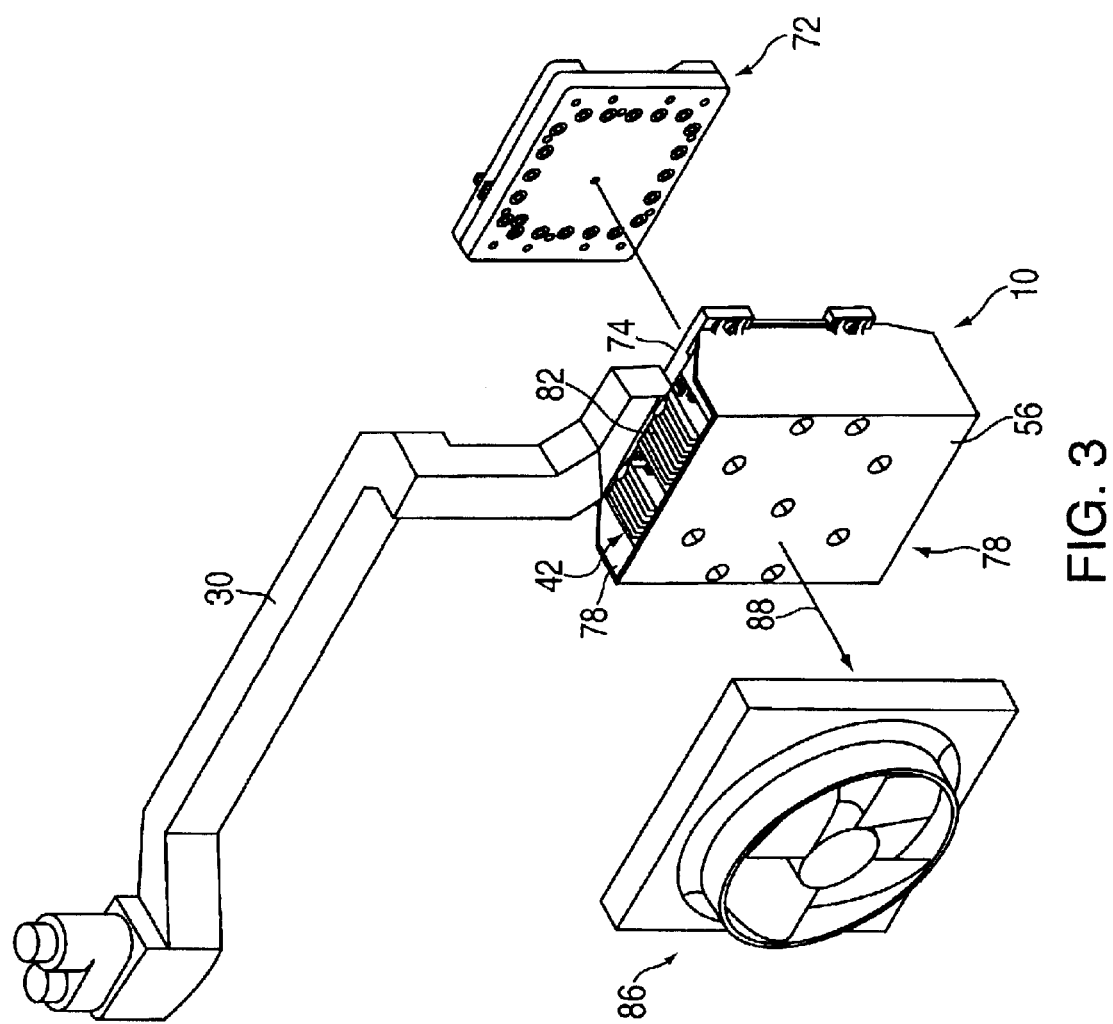
FIG. 3 is a perspective view of the evaporator unit in thermal communication with the backup air cooling unit of FIG. 2 in further thermal communication with a blower unit.

Referring now to FIG. 3, a primary air flow pattern is defined by air inducted through inlets 82 defined by the space between parallel spaced fins 46 and openings 78 defined by open sides of shroud 56. The air inducted through openings 78 and inlets 82 is preferably and ultimately exhausted through a fan 86 in the direction indicated by arrows 88. Fan 86 is preferably turned off when the refrigeration system is working properly and turned on when it is not. Shroud 60 further provides some degree of protection to fins 46 from being bent, crushed, or otherwise damaged.

Figure 4:
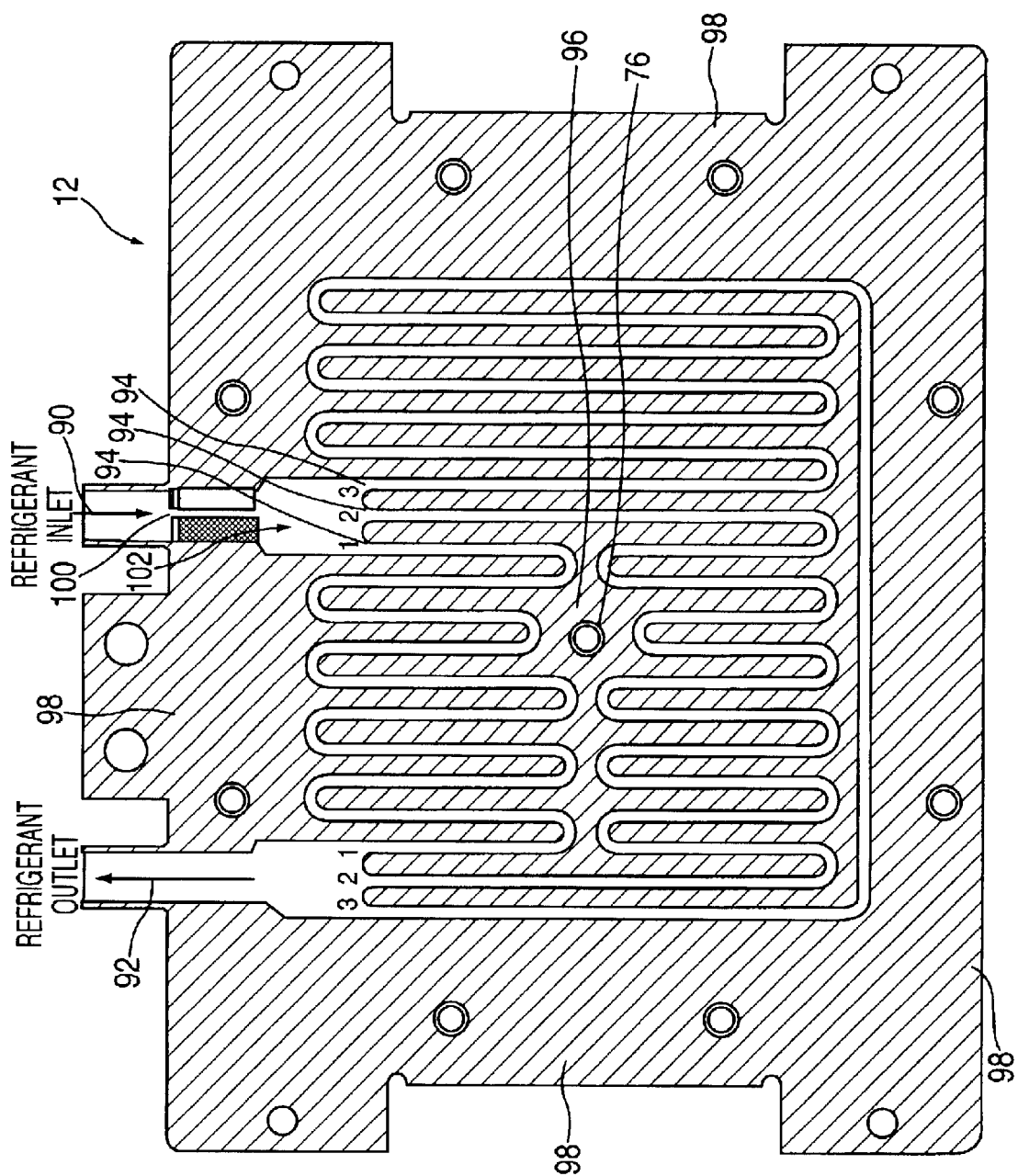
FIG. 4 is a cutaway view of the evaporator unit illustrating evaporator channels for flow of cooling liquid therein.

Referring now to FIG. 4, a sectional view of evaporator 12 of cooling unit 10 is shown. In an exemplary embodiment, manifold 20 includes an inlet port 90 and an outlet port 92 in fluid communication with each other via a plurality of evaporator channels 94. Evaporator channels 94 are preferably configured having low aspect ratios to reduce the thermal resistance path through evaporator 12 to heat sink assembly 42. Evaporator channels 94 are preferably configured to bring the coldest refrigerant from inlet port 90 to a center portion generally shown at 96 of evaporator 12 first. As the refrigerant continues to flow through evaporator channels 94, the refrigerant becomes superheated by the heat load of MCM 72 in thermal contact with an outside surface 74 of evaporator 12. As the superheated refrigerant approaches outlet port 92, evaporator channels 94 reside proximate a perimeter portion 98 defining evaporator 12. In this manner, when MCM 72 and evaporator 12 have centers substantially coaxially aligned, whereby the coldest refrigerant entering evaporator 12 through inlet port 90 traverse to center portion 96 coinciding with a center portion of MCM 72 and then exiting from evaporator 12 at a warmer temperature as refrigerant approaches outlet port 92 at perimeter portion 98 of evaporator 72 where condensation may form and provide little impact on MCM 72 temperature.

The above discussed configuration for evaporator channels 94 used in conjunction with a superheat control code of a selected refrigerant lowers the achievable junction temperature of a non-sealed evaporator. In an exemplary embodiment illustrated in FIG. 4, inlet port 90 is further defined to lower the achievable junction temperature of evaporator 12 to mitigate condensation when the coldest incoming refrigerant enters evaporator 12 via inlet port 90. More specifically, inlet port 90 is further configured with a first narrowing orifice or aperture 100 for increasing the pressure of incoming refrigerant to increase a temperature of the refrigerant and tubing entering evaporator 12 proximate perimeter portion 98 of evaporator 12. The temperature increase is about 30° C. or more. In this manner, condensation is mitigated proximate perimeter portion 98 without use of large cumbersome insulation that is impractical with an industry direction to increase processor density. Furthermore, as the pressurized refrigerant traverses to center portion 96, inlet port 90 is further configured having a second expansion orifice or aperture 102 showing the warmed refrigerant a decreased pressure and corresponding decrease in temperature, thereby providing cold refrigerant (e.g., about −20° C.) near the evaporator center without external condensation on either the incoming tubing arrangement 18 or evaporator 12 perimeter. In the event of a failure of the refrigeration system, fins 46 provide suitable backup cooling, although at higher temperatures compared to the primary cooling method by refrigeration, until the refrigerant system is repaired. In addition, a filter (not shown) is optionally disposed at aperture 100 to prevent plugging therethrough by contaminates within the refrigerant.

Still referring to FIG. 4 exemplifying an exemplary embodiment, the plurality of evaporator channels 94 is further defined by three distinct paths numbered 1–3 beginning at second expansion orifice 102 and terminating at outlet port 92. Paths 1–3 are configured as serpentine pathways beginning at center portion 96 and traversing toward perimeter portion 98. It will be recognized that the configuration of paths 1–3 illustrated in FIG. 4 is just one embodiment and not to be limited to the configuration as illustrated. FIG. 4 shows path 1 as the shortest path while path 3 is the longest. Path 1 serpentines towards outlet port 92 traversing substantially in an upper portion of evaporator 12 above aperture 76. Path 2 serpentines towards outlet port 92 traversing substantially in a lower portion of evaporator 12 below aperture 76. Path 3 serpentines away from outlet port 92 traversing substantially the upper and lower portions of evaporator 12 to the right of aperture 76, as illustrated, and then traverses the lower portion of evaporator 12 along perimeter portion 98 and then upwards toward outlet port 92 to the left of aperture 76.

Fins 46 thereby define a primary airflow pattern indicated as a first airflow passage indicated by arrows 80 in FIG. 2 and a second air flow passage indicated by arrows 84 wherein first air flow passage is defined by the parallel spaced fins 46 and the second air flow passage is defined by the absence of any fin between holes 61 of shroud 56 and apertures 52 of evaporator 12. Such a structure allows for the drawing of air over the maximum surface area of the fin arrangement, thereby allowing an optimum transfer of heat from lid 44 to be realized.

As stated above, the arrangement of fins 46 facilitates the convective flow of air in directions indicated by arrows 80 and 84. Fins 46 are generally planar structures that extend longitudinally over the height of cooling unit 10. The attachment of the fin arrangement to lid 44 is such that major opposing planar surfaces of fins 46 extend substantially normally from lid 44 and longitudinally along the height of cooling unit 10.

Shroud 56, as stated above, is disposed over fins 46 to provide a protective covering over Fins 46 and to define second airflow passages through holes 61. Shroud 56 may be fabricated from any material that can be formed or molded into the appropriate shape, such as metal, plastic, or fiberglass. In an exemplary embodiment, shroud 32 is fabricated from metal, preferably aluminum, wherein holes 61 defining secondary air inlet ports can be formed by stamping and bending the material of shroud 56. Holes 61 are aligned with corresponding apertures 50 and 52 located at various positions along top cover 60 of shroud 56. Such openings extend through shroud 56 to allow for airflow-communication between lid 44 and the environment immediately adjacent to shroud 56. Positioning of secondary air inlet port holes 61 to register with the second air flow passages facilitates the drawing of air into the fin arrangement (as is illustrated by arrows 84) to mitigate the temperature rise of air flowing in the second air flow passages, thereby improving the overall heat transfer performance of cooling unit 10. Additionally, the use of secondary air inlet port holes 61 reduces the overall air flow pressure drop over the length of each air flow passage though inlets 82 to result in an increased air flow rate longitudinally along cooling unit 10.

The above described apparatus discloses an evaporator that uses refrigeration as a primary cooling means and uses air cooling as a secondary cooling means for a backup mode of operation for cooling an electronic device. In this manner, the above disclosed evaporator enables the benefits of refrigeration with cost and space savings of air cooling. The above described evaporator also allows lower chip temperatures without use of insulation that would inhibit the effectiveness of the air cooled backup mode. Thus, the primary and secondary cooling means disclosed allows an MCM to operate at faster cycle times with greater reliability when refrigerated and yet be satisfactorily cooled for short term usage with backup air cooling when the refrigerant system becomes inoperable. The redundant cooling provided by the air cooling means allows uninterrupted service in high end servers and avoids system shutdowns while the refrigerant system is repaired.

While the disclosure has been described with reference to a preferred embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A heat exchanger, especially for air or liquid cooling of at least one heat-producing component, said heat exchanger comprising:

a base plate configured in heat exchanging contact with the at least one heat-producing component to provide at least one of air and liquid cooling thereof wherein said base plate includes an evaporator lid, said base plate and said evaporator lid are fabricated from copper and metallurgically joined;

a plurality of liquid flow conduits in fluid flow communication with inlet and outlet manifold means with fluid being suppliable to and withdrawable from said inlet and outlet manifold means through said base plate, said liquid flow conduits are in heat exchanging contact with a first outside surface and a second outside surface defining two sides of said base plate, said liquid flow conduits configured to provide fluid transfer of a liquid coolant therein; and a plurality of heat sink fins arranged in parallel with respect to one another, said fins are in thermal contact with said first outside surface of said base plate which in turn is in heat exchanging contact with the second outside surface in thermal contact with the heat-producing component.

2. The heat exchanger of claim 1, wherein said fins are fabricated from copper, copper alloys, aluminum, aluminum alloys, nickel plated copper, and combinations of the foregoing materials.

3. The cooling unit of claim 1, further comprising a blower unit configured to provide a forced induction of air over said plurality of heat sink fins.

4. The heat exchanger of claim 1, wherein said plurality of heat sink fins are coupled to said base plate by one of solder and braze providing a low resistance thermal path for heat flow from said base plate to said plurality of heat sink finks.

5. The heat exchanger of claim 4 wherein said plurality of heat sink fins are coupled to said evaporator lid configured with holes aligned with complementary holes in said base plate for receiving captive fastening means for fastening said evaporator lid and said base plate to said heat producing component.

6. The heat exchanger of claim 5 wherein said base plate is an evaporator including a base plate portion and a flow plate portion, said flow plate portion configured having said plurality of liquid flow conduits, said base plate portion configured having said inlet and outlet manifold means, said evaporator lid disposed on one surface of said evaporator to provide heat exchanging contact with the heat-producing component in thermal contact with an opposite side of said evaporator.

7. The heat exchanger of claim 6 wherein said inlet and outlet manifold means are coupled to tubing that transports said liquid coolant to and from said evaporator, said tubing is at least partially surrounded with insulation.

8. The heat exchanger of claim 7 wherein said evaporator is configured with an inlet of said inlet and outlet manifold means positioned in a central portion of said evaporator to deliver a coldest portion of said liquid coolant to said central portion first.

9. The heat exchanger of claim 8 wherein said plurality fluid flow conduits includes a plurality of serpentine evaporator channels in fluid communication with said inlet at said central portion of said evaporator and terminating at an outlet of said inlet an outlet manifold means.

10. The heat exchanger of claim 9 wherein said inlet extends from said evaporator at one end and leads to said plurality of serpentine evaporator channels at another end, said inlet includes a throat section defining a first aperture at a first end and a second aperture at a second end of said throat section, said first aperture configured to increase a pressure or entering fluid flow and temperature thereof while said second aperture is configured to decrease pressure of exiting fluid flow resulting in a decrease of temperature thereof to mitigate condensation proximate said inlet extending from said evaporator and an outside surface of said evaporator proximate said inlet extending from said evaporator exposed to ambient air.

11. The heat exchanger of claim 10 wherein said serpentine evaporator channels are configured with a low aspect ratio to reduce a thermal resistance path from said evaporator to said heat sink fins.

12. The heat exchanger of claim 11 wherein said heat-producing component is a multi-chip module aligned with said central portion of said evaporator.

13. A heat transfer device for a heat-producing component of an electronic device, comprising:

a cooling plate assembly having an inner face of a flow plate portion along which a plurality of serpentine channels extend; said inner face being securable in liquid tight engagement with surface of a base plate portion of said cooling plate assembly in heat exchanging contact with the heat-producing component on an opposite surface, said channels being configured to define, with the surface, when said inner face is secured to the surface, a passageway so that liquid coolant circulating through said passageway is in direct contact with said surface, said channels configured to receive a coldest portion of the liquid coolant in a central portion of the surface; and a plurality of heat sink fins extending from a lid plate in heat exchanging contact with the flow plate portion on an outer face opposite the inner face, wherein said cooling plate assembly and said lid plate have a plurality of corresponding openings extending therethrough, and said surface is an inner surface or said base plate portion; and said inner face of the base plate portion is securable to said inner surface, to secure said inner face in liquid tight engagement with said inner surface, by a plurality of fasteners extending through said corresponding openings, respectively.

14. The heat transfer device of claim 13 wherein said cooling plate assembly is an evaporator including the base plate portion and the flow plate portion, said flow plate portion configured having said plurality of serpentine channels, said base plate portion configured having an inlet and outlet manifold means, said lid plate portion disposed on one surface of said evaporator to provide heat exchanging contact with the heat-producing component in thermal component contact with an opposite side of said evaporator.

15. The heat transfer device of claim 14 wherein a shroud is disposed over said fins, said shroud configured having shroud holes aligned with said-corresponding holes in said cooling plate assembly and said lid plate to provide at least one of access to said mounting means and heat exchange between said base plate and ambient air.

16. The heat transfer device of claim 15 wherein said evaporator is configured with an inlet of said inlet and outlet it manifold means positioned in a central portion of said evaporator to deliver a coldest portion of said liquid coolant to said central portion first.

17. The heat transfer device of claim 16 wherein said plurality of channels includes a plurality of serpentine evaporator channels in fluid communication with said inlet at said central portion of said evaporator and terminating at in outlet of said inlet and outlet manifold means.

18. The heat transfer device of claim 17 wherein said inlet extends from said evaporator at one end and leads to said plurality of serpentine evaporator channels at another end, said inlet includes a throat section defining a first aperture at a first end and a second aperture at a second end, said first aperture configured to increase a pressure of entering fluid flow and temperature thereof while said second aperture configured to decrease pressure of exiting fluid flow resulting in a lower temperature thereof to mitigate condensation proximate said inlet extending from said evaporator and an outside surface of said evaporator proximate said inlet extending for said evaporator exposed to ambient air.

19. The heat transfer device of claim 18 wherein said serpentine evaporator channel are configured with a low aspect ratio to reduce a thermal resistance path from said evaporator to said heat sink fins.

* * * * *